(12) United States Patent
Kim et al.

(10) Patent No.: US 6,768,670 B2
(45) Date of Patent: Jul. 27, 2004

(54) WRITING METHOD FOR MAGNETIC RANDOM ACCESS MEMORY USING A BIPOLAR JUNCTION TRANSISTOR

(75) Inventors: Chang Shuk Kim, Kyoungki-do (KR); Hee Bok Kang, Daejeon (KR); Christine H. Kyung, Kyoungki-do (KR); In Woo Jang, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/316,662

(22) Filed: Dec. 11, 2002

(65) Prior Publication Data

US 2003/0117836 A1 Jun. 26, 2003

(30) Foreign Application Priority Data

Dec. 26, 2001 (KR) .............................. 10-2001-0084900

(51) Int. Cl.$^7$ ............................................. G11C 11/58
(52) U.S. Cl. ........................................ 365/173; 365/158
(58) Field of Search ................................ 365/158, 171, 365/173, 178

(56) References Cited

U.S. PATENT DOCUMENTS 5,565,695 A * 10/1996 Johnson ...................... 257/295
5,798,963 A * 8/1998 Iga .............................. 365/97

* cited by examiner

Primary Examiner—Tan T. Nguyen
(74) Attorney, Agent, or Firm—Marshall, Gerstein & Borun LLP

(57) ABSTRACT

A writing method for a magnetic random access memory (MRAM) using a bipolar junction transistor is disclosed. The writing method is for use with the MRAM using the bipolar junction transistor including: a semiconductor substrate serving as a base of the bipolar junction transistor; an emitter and a collector of the bipolar junction transistor formed in an active region of the semiconductor substrate; an MTJ cell positioned in the active region between the emitter and the collector, separately from the emitter and the collector by a predetermined distance; a word line formed on the MTJ cell; a bit line connected to the collector; and a reference voltage line connected to the emitter. The writing method for the MRAM using the bipolar junction transistor writes data by applying current from the emitter to the collector, and changing a magnetization direction of a free ferromagnetic layer of the MTJ cell by a magnetic field generated due to the current. The magnetization direction can be varied in a shorter distance than a distance between the MTJ cell and the bit line, thereby reducing current consumption. It is thus possible to improve a property and reliability of the semiconductor device.

2 Claims, 2 Drawing Sheets

WRITING METHOD FOR MAGNETIC RANDOM ACCESS MEMORY USING A BIPOLAR JUNCTION TRANSISTOR

BACKGROUND

1. Technical Field

The present invention relates to a writing method for a magnetic random access memory (abbreviated as 'MRAM') including a bipolar junction transistor and, in particular, to an improved writing method for an MRAM having a higher speed than the static random access memory (SRAM), integration as high as the dynamic random access memory (DRAM), and a property of a nonvolatile memory such as a flash memory.

2. Description of the Related Art

Most of the semiconductor memory manufacturing companies have developed an MRAM using a ferromagnetic material and consider the MRAM as one of the next generation memory devices.

The MRAM is a memory device for reading and writing information by forming multi-layer ferromagnetic thin films, and sensing current variations according to magnetization directions of the respective thin films. The MRAM has a high operating speed, low power consumption and high integration density, all of which are made possible by the special properties of the magnetic thin film. MRAM devices may perform nonvolatile memory operations that are presently carried out using a flash memory.

The MRAM embodies a memory device using either a giant magneto resistive (abbreviated as 'GMR') phenomenon or a spin-polarized magneto-transmission (SPMT) phenomenon generated when the spin influences electron transmission.

MRAM devices based on the GMR phenomenon utilize the phenomenon that resistance vanes remarkably when spin directions are different in two magnetic layers having a non-magnetic layer therebetween, which is how a GMR magnetic memory device is implemented.

MRAM devices based on the SPMT approach utilize the phenomenon that larger current transmission is generated when spin directions are identical in two magnetic layers having an insulating layer therebetween, which is how a magneto-transmission junction memory device is implemented.

However, MRAM research is still in its early stage. Today, MRAM research is mostly concentrated on the formation of multi-layer magnetic thin films and is less focused on research pertaining to unit cell structure and to peripheral sensing circuits.

FIG. 1 is a cross-sectional diagram illustrating a conventional MRAM using a bipolar junction transistor. As shown in FIG. 1, the MRAM includes a semiconductor substrate 111 used as a base of the bipolar junction transistor, an emitter 113a and a collector 113b formed in an active region of the semiconductor substrate 111 according to an implant process and a stacked structure of an MTJ cell 121 and a word line 123 positioned in the active region between the emitter 113a and the collector 113b, spaced apart from the emitter 113a and the collector 113b by a predetermined distance. The emitter 113a and the collector 113b are formed according to an implant process using a mask. The MRAM also includes a bit line 135 connected to the collector 113b and a reference voltage line 127 connected to the emitter 113a. Here, a gate oxide film (not shown) is not formed below the MTJ cell 121 or word line 123.

The MTJ cell 121 comprises a stacked structure including a free ferromagnetic layer 115, a tunnel barrier layer 117 and a pinned ferromagnetic layer 119. At this time, at least three multiple data recording states including '0' or '1' can be obtained in one cell of the memory device. These states are created by setting up a magnetization direction of the free ferromagnetic layer 115 to be identical to or opposite to a magnetization direction of the pinned ferromagnetic layer 119 or to have a predetermined angle.

The bit line 135 is connected to the collector 113b through a connection line 129 and a contact plug 133.

With reference to FIG. 1, a conventional method for fabricating the MRAM will now be described. A mask layer (not shown) for exposing a predetermined region of the emitter and collector is formed in the active region of the semiconductor substrate 111. The emitter 113a and the collector 113b are formed by implanting an impurity into the semiconductor substrate 111, and the mask layer is then removed.

The stacked structure of the pinned ferromagnetic layer 115, the tunnel barrier layer 117 and the free ferromagnetic layer 119 is formed over the resultant structure to form the MTJ cell.

The MTJ cell 121 of an island type is formed by patterning the stacked structure of the pinned ferromagnetic layer 115, the tunnel barrier layer 117 and the free ferromagnetic layer 119 according to a photolithography process using an MTJ cell mask (not shown).

A conductive layer for a word line is formed over the resultant structure, and patterned to form the word line 123 according to a photolithography process using a word line mask (not shown). This procedure forms the stacked structure of the MTJ cell 121 and the word line 123. Here, the word line 123 may comprise a mask insulating film at its upper portion, which results in an improved insulating property.

The stacked structure of the MTJ cell 121 and the word line 123 is formed in the active region between the emitter 113a and the collector 113b. The MTJ cell 121 and the word line 123 are spaced apart from the emitter 113a and the collector 113b by a predetermined distance.

Thereafter, a first interlayer insulating film 125 is formed to planarize the top surface of the resultant structure. Here, the first interlayer insulating film 125 is planarized to expose the upper portion of the word line 123.

The connection line 129 and the reference voltage line 127 are formed to respectively contact the emitter 113a and the collector 113b through the first interlayer insulating film 125.

A second interlayer insulating film 131 is formed over the resultant structure, and evenly etched to planarize the top surface thereof.

A bit line contact plug 133 is formed to contact the connection line 129 through the second interlayer insulating film 131.

Here, the connection line 129 is exposed by etching the second interlayer insulating film 131 according to a photolithography process using a bit line contact mask (not shown). After etching, a conductive layer for a bit line contact plug is deposited to contact the connection line 129, and evenly etched to expose the second interlayer insulating film 131, thereby forming the bit line contact plug 133.

The bit line 135 is formed to contact the bit line contact plug 133.

Here, the bit line 135 is formed by depositing and patterning a conductive layer for a bit line contacting the bit line contact plug 133.

The operation of the MRAM will now be described with reference to FIG. 1.

A data write operation is performed by applying current to the word line 123 and the bit line 135 regardless of the transistor.

When the current is applied to the word line 123, the current does not flow toward the transistor due to resistance elements of the tunnel barrier layer 117 formed between the pinned ferromagnetic layer 115 and the free ferromagnetic layer 119 in the MTJ cell 121. Rather, the current flows toward the word line 123.

The current applied to the bit line 135 does not flow from the collector of the bipolar junction transistor to the base or emitter thereof, but flows through the bit line itself.

An amount and direction of the current in the word line 123 and the bit line 135 crossing each other in a vertical direction or at a predetermined angle, are controlled. The amount and direction of the current sets up the magnetization direction of the free ferromagnetic layer 119 of the MTJ cell 121 in a desired direction, thereby performing the data write operation.

After the data write operation, the magnetization direction of the free ferromagnetic layer 119 of the MTJ cell 121 is set to be identical to or opposite to the magnetization direction of the pinned ferromagnetic layer 115. Alternatively, the MTJ cell 121 may be set up at a predetermined angle with respect to the magnetization direction.

The MTJ resistance varies according to the angle between the free ferromagnetic layer 119 and the pinned ferromagnetic layer 115. The data write operation is performed using the MTJ resistance values.

In a data read operation, a voltage is applied to the bit line 135 and the word line 123. Here, the current does not flow in the bit line 135 or the word line 123.

When the current flows through the MTJ cell 121 due to the voltage applied to the word line 123, a voltage drop appears due to the resistance of the MTJ cell 121, thereby allowing the voltage applied to the input terminal of the transistor, namely the semiconductor substrate 111, to vary according to the resistance value of the MTJ cell 121.

Therefore, when the voltage and current applied to the input terminal are varied, a signal at the collector 113b varies. A reading of the information is performed by sensing the signal at the bit line connected to the output terminal of the transistor.

As described above, the conventional method of writing information to the MRAM using the bipolar junction transistor inverts the magnetization direction of the MTJ free ferromagnetic layer according to a magnetic field generated due to the current flowing through the word line 123 and the bit line 135. As a result, the current must be applied to the bit line 135 at a location that is far from the MTJ cell 121 to obtain a desired magnetic field intensity. The fact that the current must be applied to the bit line a significant distance from the MTJ cell results in high current consumption when writing information to the MRAM device.

SUMMARY OF THE DISCLOSURE

In accordance with one aspect of the disclosure, an operation method for use with a magnetic random access memory (MRAM) using a bipolar junction transistor is disclosed. The MRAM may include a semiconductor substrate serving as a base of the bipolar junction transistor, an emitter and a collector of the bipolar junction transistor respectively formed on a first portion and a second portion of the semiconductor substrate, wherein the emitter and the collector are spaced apart and a MTJ cell formed in the semiconductor substrate between the emitter and the collector. The MRAM may also include a word line formed on the MTJ cell, a bit line connected to the collector and a reference voltage line connected to the emitter. The method may include applying current from the emitter to the collector and changing a magnetization direction and angle of a free ferromagnetic layer of the MTJ cell using a magnetic field generated by the applied current, thereby writing data.

In accordance with another aspect of the disclosure, a magnetic random access memory (MRAM) using a bipolar junction transistor is disclosed. The MRAM may include a semiconductor substrate serving as a base of the bipolar junction transistor, an emitter and a collector of the bipolar junction transistor respectively formed on a first portion and a second portion of the semiconductor substrate, wherein the emitter and the collector are spaced apart and a MTJ cell formed in the semiconductor substrate between the emitter and the collector. The MRAM may also include a word line formed on the MTJ cell, a bit line connected to the collector and a reference voltage line connected to the emitter. The MRAM further includes a current source connected to the emitter for applying current from the emitter to the collector.

DETAILED DESCRIPTION OF THE PRESENTLY PREFERRED EMBODIMENTS

A writing method for a magnetic random access memory including a bipolar junction transistor will now be described in detail with reference to the accompanying drawings.

Figure 1:
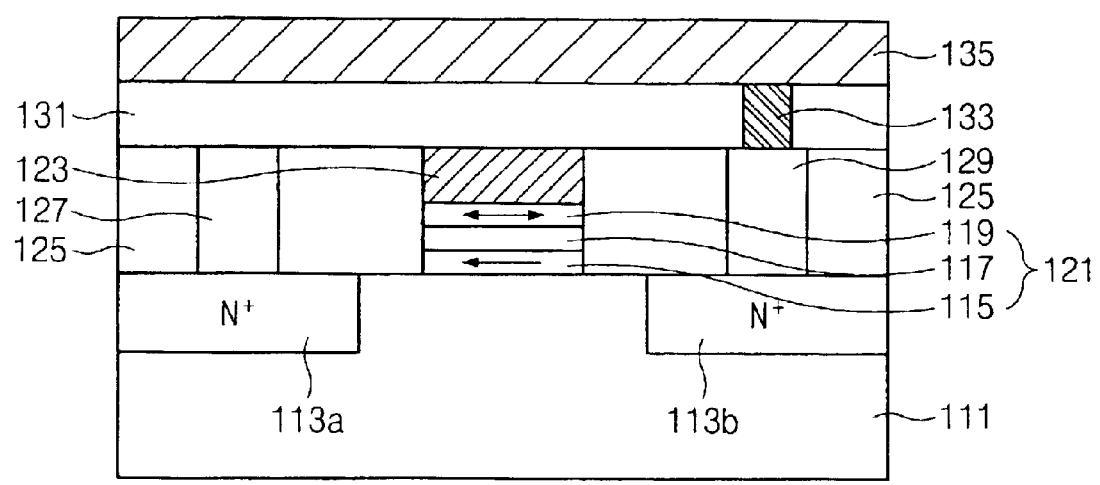
FIG. 1 is a cross-sectional diagram illustrating a conventional writing method for an MRAM using a bipolar junction transistor.
Figure 2:
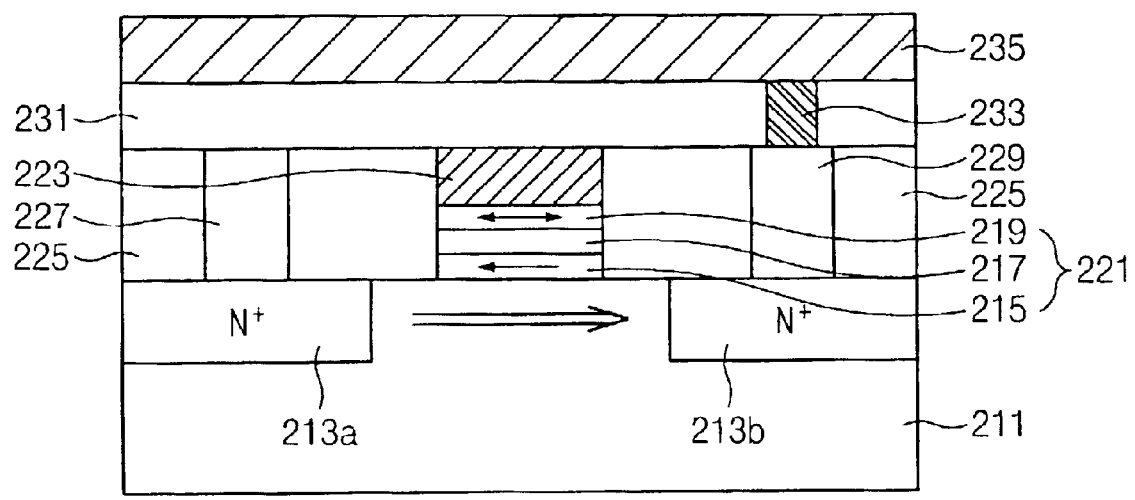
FIG. 2 is a cross-sectional diagram illustrating the disclosed writing method for an MRAM using a bipolar junction transistor.

FIG. 2 is a cross-sectional diagram illustrating the disclosed writing method for the MRAM including the bipolar junction transistor. The MRAM structure of FIG. 2 has the same or substantially the same constitution as the MRAM of FIG. 1.

The operation of the MRAM is now explained with reference to FIG. 2. A data write operation is performed by applying a large amount of current from an emitter 213a of the bipolar junction transistor to a collector 213b through a base, namely through a semiconductor substrate 211.

The data write operation is executed by generating a magnetic field by applying the current to the collector 213b, and controlling the current to set a magnetization of a free ferromagnetic layer 219 in an MTJ cell 221 in a desired direction.

After the data write operation, the magnetization direction of the free ferromagnetic layer 219 is identical to or opposite to a magnetization direction of a pinned ferromagnetic layer 215. Alternatively, the magnetization of the free ferromagnetic layer 219 may have a predetermined angle with respect to the pinned ferromagnetic layer 215.

A resistance value of the MTJ cell 221 varies according to an angle between the free ferromagnetic layer 219 and the pinned ferromagnetic layer 215, which is used to perform the data write operation.

On the other hand, in a data read operation, a voltage is applied to a bit line 235 and a word line 223. When current flows through the MTJ cell 221 due to the voltage applied to the word line 223, the voltage drop appears due to the resistance of the MTJ cell 221, thereby allowing the voltage applied to the input terminal of the transistor, namely the semiconductor substrate 211, to vary according to the resistance value of the MTJ cell 221.

When the voltage and current applied to the input terminal are varied, a signal appearing at the collector 213b is varied. A reading of information is performed by sensing the signal at the bit line connected to the output terminal of the transistor.

As discussed earlier, the write operation is performed by forming the MTJ cell 221 as the input terminal of the bipolar junction transistor, applying the current from the emitter of the bipolar junction to the collector through the base, and controlling the magnetization direction of the free ferromagnetic layer of the MTJ cell by using the current. The magnetization direction of the free ferromagnetic layer can be controlled by using a minimal amount of current, thereby improving a property and reliability of the device.

The disclosed writing method for writing to a magnetic random access memory (MRAM) using a bipolar junction transistor efficiently performs a write operation with a small amount of current. Only a small amount of current is required because a magnetic field is generated using current that is excited in an adjacent position and that flows from an emitter to a collector of the bipolar junction transistor. In principle, the write and read operations of the device may be performed with a small amount of current by adjusting the magnetization direction of the free ferromagnetic layer using current flowing from the emitter to the collector.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. An operation method for use with a magnetic random access memory (MRAM) using a bipolar junction transistor comprising: a semiconductor substrate serving as a base of the bipolar junction transistor; an emitter and a collector of the bipolar junction transistor respectively formed on a first portion and a second portion of the semiconductor substrate, wherein the emitter and the collector are spaced apart; a MTJ cell formed in the semiconductor substrate between the emitter and the collector; a word line formed on the MTJ cell; a bit line connected to the collector; and a reference voltage line connected to the emitter, the method comprising:

applying current from the emitter to the collector; and changing a magnetization direction and angle of a free ferromagnetic layer of the MTJ cell using a magnetic field generated by the applied current, thereby writing data.

2. A magnetic random access memory (MRAM) using a bipolar junction transistor comprising: a semiconductor substrate serving as a base of the bipolar junction transistor; an emitter and a collector of the bipolar junction transistor respectively formed on a first portion and a second portion of the semiconductor substrate, wherein the emitter and the collector are spaced apart; a MTJ cell formed in the semiconductor substrate between the emitter and the collector; a word line formed on the MTJ cell; a bit line connected to the collector; and a reference voltage line connected to the emitter, the magnetic random access memory further comprising:

a current source connected to the emitter for applying current from the emitter to the collector.

* * * * *